United States Patent
Kim et al.

[11] Patent Number: 5,838,027
[45] Date of Patent: Nov. 17, 1998

[54] SEMICONDUCTOR DEVICE AND A METHOD FOR MANUFACTURING THE SAME

[75] Inventors: Ho-Hyun Kim, Seoul; Jae-Hong Park, Bucheon-si, both of Rep. of Korea

[73] Assignee: Samsung Electronics Co., Ltd., Kyungki-Do, Rep. of Korea

[21] Appl. No.: 840,904

[22] Filed: Apr. 17, 1997

Related U.S. Application Data

[63] Continuation of Ser. No. 565,596, Nov. 30, 1995, abandoned.

[30] Foreign Application Priority Data

Nov. 30, 1994 [KR] Rep. of Korea ................ 1994 31900

[51] Int. Cl.⁶ .................................................. H01L 29/744
[52] U.S. Cl. .......................... 257/139; 257/212; 257/341; 257/655
[58] Field of Search ..................... 257/139, 140, 257/141, 142, 143, 144, 145, 212, 263, 341, 342, 655

[56] References Cited

U.S. PATENT DOCUMENTS

| | | | |
|---|---|---|---|
| 4,985,741 | 1/1991 | Bauer et al. | 257/145 |
| 5,025,293 | 6/1991 | Seki | 257/212 |
| 5,031,009 | 7/1991 | Fujihara | 257/212 |
| 5,200,632 | 4/1993 | Sakurai | 257/212 |
| 5,355,003 | 10/1994 | Tomomatsu | 257/139 |
| 5,569,941 | 10/1996 | Takahashi | 257/133 |

*Primary Examiner*—David B. Hardy
*Attorney, Agent, or Firm*—Cushman Darby & Cushman IP Group of Pillsbury Madison & Sutro LLP

[57] ABSTRACT

An IGBT (Insulated Gate Bipolar Transistor) is composed of a $P^+$ silicon substrate, a first epitaxial layer in which the first conductive type high density impurities are composed at a gentle slope, a semiconductor substrate which is located at the above first epitaxial layer and composed of a second epitaxial layer formed of the first conductive type low density impurities, a $P^-$ well which is composed at the surface part of the second epitaxial layer, an active area which is formed and included in the $P^-$ well, and a gate electrode which is folded with part of the edge of the $P^-$ well, included by an insulated oxidation film and formed on the semiconductor substrate. The first epitaxial layer corresponding to the lower part of the above $P^-$ well is composed of the first conductive type low density impurities, and the first epitaxial layer corresponding to the lower part of a gate electrode, in which an insulated oxidation film is included, is composed of the first conductive type high density impurities layer, and has a structure in which an $N^+$ and an $N^-$ layers are formed horizontally by turns. Latch-up phenomenon during normal operation is restrained, by improving the epitaxial layer of the semiconductor substrate, and reliability of the semiconductor device is enhanced by increasing the safe operating area and short circuit stability.

3 Claims, 4 Drawing Sheets

SEMICONDUCTOR DEVICE AND A METHOD FOR MANUFACTURING THE SAME

This is a continuation of application Ser. No. 08/565,596, filed on Nov. 30, 1995, which was abandoned upon the filing hereof.

BACKGROUND OF THE INVENTION

(1) Field of Invention

The present invention relates in general to a semiconductor device, and more particularly, to an insulated gate bipolar transistor (IGBT) in which the epitaxial layer of its semiconductor substrate is adjusted so as to improve a safe opening area, short circuit stability, and a latch-up phenomenon of the device.

(2) Description of Related Art

Generally, the basic structure of an IGBT is the same as that of a power metal-oxide semiconductor field effect transistor (MOSFET), except that an $N^+$ layer is changed into a $P^+$ layer on the collector (drain) side and one PN junction is added. As illustrated in FIG. 1, a semiconductor substrate (wafer) forming the basis of a conventional IGBT is produced so as to have a double epitaxial structure of $N^-$ and $N^+$ layers, wherein an $N^+$ epitaxial layer (12) doped with high density N-type ions having 5 valence electrons and an $N^-$-epitaxial layer (13) doped with low density ions are formed on top of a $P^+$ silicon substrate (11) doped with high density ions having 3 valence electrons, by using a double epitaxial growth method.

FIG. 2 is a diagram illustrating the density distribution of impurities and the slope thereof according to a perpendicular plane with respect to the semiconductor substrate in FIG. 1. It shows that the slopes of the impurity densities between junctions are steep.

FIG. 3 shows the basic structure of an IGBT having a gate electrode (17), and in which a $P^-$ well (14), an emitter region (15) and an insulated oxidation film (16) are intervened on the above described semiconductor substrate according to a conventional method. Reference number 18 designates an emitter electrode.

In a conventional IGBT having the above-described structure, holes flowing from the $P^+$ (11) layer into the $N^-$ (13) layer at turn-on increase the electron density of the $N^-$ layer (13) and lower the resistance of the $N^-$ layer, by holding electrons through the conduction modulation effect. However, this structure may generate a latch-up phenomenon causing thermal fracture by losing a control function, because a thyristor (PNPN) structure may occur parasitically.

In the $N^+$ epitaxial layer (12) formed by the epitaxial growth method, it is technically difficult to maintain impurities uniformly throughout the $N^+$ epitaxial layer (12). If the low density $N^-$ epitaxial layer (13) is grown after forming the $N^+$ epitaxial layer (12), it is not easy to adjust the impurity densities, because the impurities remaining on the surface of the $N^+$ epitaxial layer (12) have an effect on the low density $N^-$ epitaxial layer (13). Also, if an IGBT having a semiconductor substrate produced by the epitaxial growth method is used, its application in a system may be substantially restricted, because its safe operating area is narrow and its short-circuit stability is small.

In order to solve these problems, particularly to extend the safe operating area, a conventional device structure has a non-punch-through operating form, by extending further the thickness of the $N^-$ epitaxial layer. As illustrated in FIG. 4, a conventional IGBT structure having this form is composed of a semiconductor substrate of which the $N^-$ layer (22) is formed thickly on a $P^+$ silicon substrate (21), a $P^-$ well (23) formed at the surface part of the above-described semiconductor substrate, and a gate electrode in which an active area (24) and an insulated oxidation film (25) are included, in order to improve the short circuit stability and establish the safe operating area more broadly. Nevertheless, these IGBT devices of a non-punch-through operating form have a problem in that they increase unnecessary saturation voltage.

SUMMARY OF THE INVENTION

An object of the present invention is to provide an IGBT, which promotes a safe operating area, short circuit stability and reduced latch-up phenomenon, and a method for manufacturing the same.

The features of a preferred embodiment of the present invention in the production method of a semiconductor substrate to achieve the above purpose include growing a first low density epitaxial layer on a silicon substrate, implanting high density impurities, by a method of ion-implantation, throughout the substrate on which the first epitaxial layer is grown, growing a second low density epitaxial layer, and heat treating to adjust the slope of impurity densities in the first epitaxial layer, in order to improve the safe operating area of the IGBT.

Another preferred embodiment of the method of the present invention includes growing a first low density epitaxial layer on a $P^+$ silicon substrate, forming a thermal oxidation film on the first epitaxial layer, removing the above thermal oxidation film corresponding to the area, in which an insulated gate is formed, by forming a photoconductive film pattern, implanting high density impurities throughout the product by ion-implantation, removing the remaining thermal oxidation film, growing a second low density epitaxial layer, in order to improve the latch-up phenomenon of an IGBT.

Furthermore, a preferred embodiment of the present invention includes a $P^-$ well which is formed on a semiconductor substrate, an active area which is formed on the above $P^-$ well, and a gate electrode which is formed by including an insulated oxidation film on the above semiconductor substrate.

DETAILED DESCRIPTION OF THE PREFERRED EMBODIMENT

Figure 1:
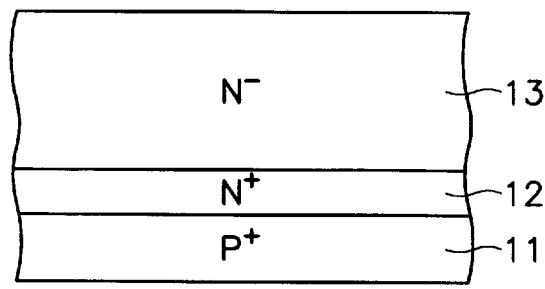
FIG. 1 is a perpendicular-to-layer sectional view illustrating a semiconductor substrate for forming a conventional IGBT.

Reference will now be made in detail to a preferred embodiment of the invention, an example of which is illustrated in FIGS. 5–12 of the accompanying drawings. Wherever possible, the same reference characters will be used throughout the drawings to refer to the same or like parts.

Figure 5:
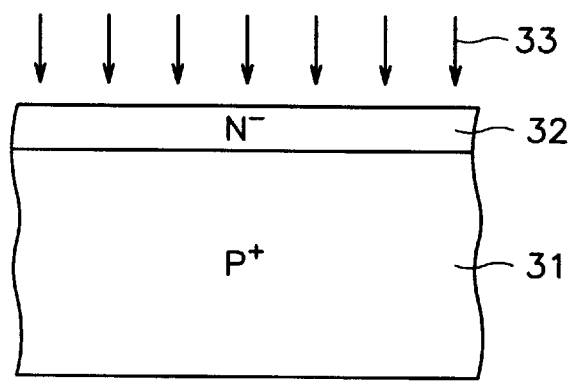
FIGS. 5 and 6 are perpendicular-to-layer sectional views illustrating a process for producing a semiconductor substrate for an IGBT according to the principles of the present invention.
Figure 6:
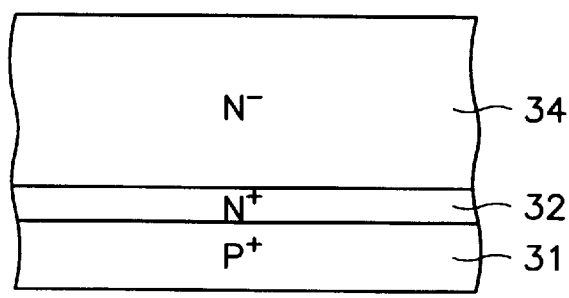

First of all, to solve the problem of increasing an unnecessary saturation voltage, as afflicting in a conventional IGBT of a non-punch-through operating form, after growing a first low density thin N-type epitaxial layer (or, a buffer layer) (32) on a $P^+$ silicon substrate (31) as in FIGS. 5 and 6, and then, after implanting high density $N^+$-type impurities throughout the surface of the first epitaxial layer (32) by ion-implantation (FIG. 5), and after forming a low density layer (34) (FIG. 6), the slope, maximum density and diffusion depth of the $N^+$ impurities of the above first epitaxial layer (32) are adjusted through the diffusion heat treatment process (FIG. 6).

Figure 2:
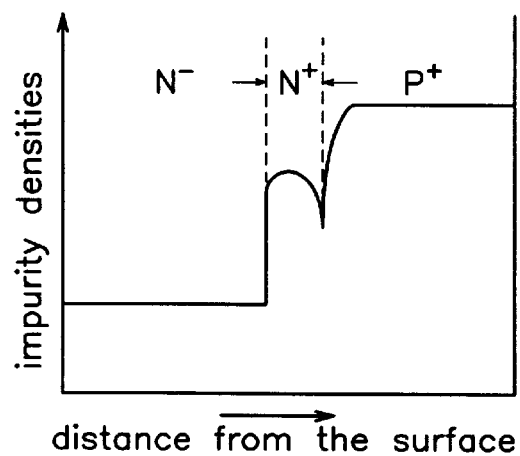
FIG. 2 is a diagram illustrating the distribution and slope of impurity densities in the perpendicular section of the semiconductor substrate illustrated in FIG. 1.
Figure 3:
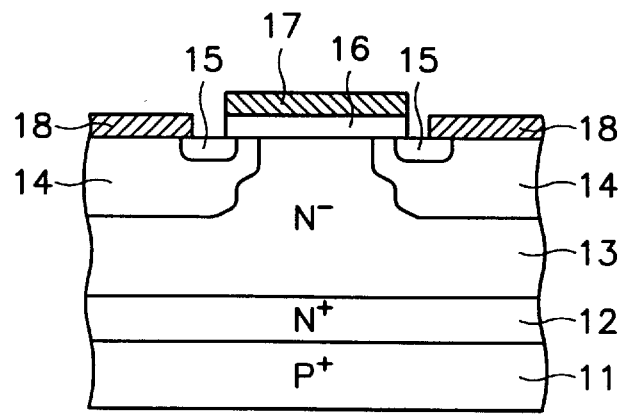
FIG. 3 is a perpendicular-to-layer sectional view illustrating one embodiment of a conventional IGBT.
Figure 4:
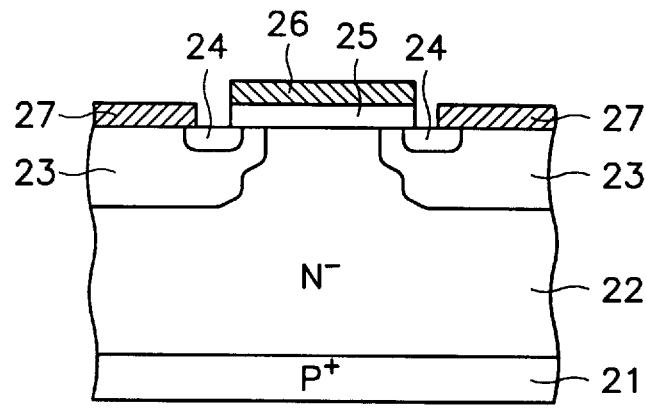
FIG. 4 is a perpendicular-to-layer sectional view illustrating another embodiment of a conventional IGBT.
Figure 7:
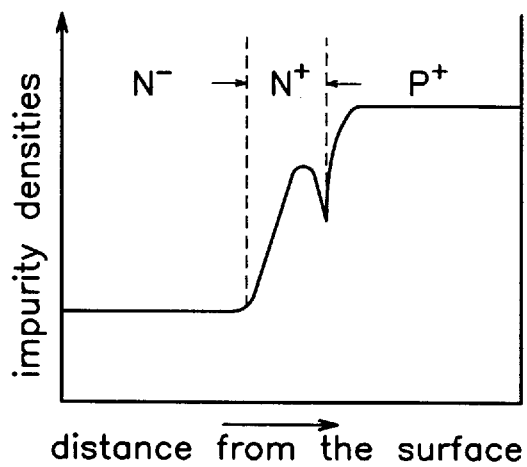
FIG. 7 is a diagram illustrating the distribution and slope of impurity densities in the semiconductor substrate section illustrated in FIG. 6.

FIG. 7 illustrates the distribution of impurity densities in the perpendicular section of a semiconductor substrate in FIG. 6 and shows that the density slope of a high density $N^+$ epitaxial layer (32) has a gentle grade. In other words, the differences between the impurity concentrations at the junctions between the high density $N^+$ epitaxial layer 32 and both adjacent layers are less severe than in the conventional IGBT, as illustrated in FIG. 2. In particular, it should be noted that the impurity concentration of the $N^+$ epitaxial layer 32 is substantially the same as the concentration in the $N^-$ layer 34 near their junction, and that it rises to a maximum level with a substantially uniform grade, almost linearly, in accordance with an increasing distance with respect to the surface of the resultant structure.

If an IGBT is formed by using a semiconductor substrate having an $N^+$ buffer layer of a gentle slope according to a preferred embodiment of the present invention, the short circuit stability and safe operating area can be extended without increasing the saturation voltage heavily. Furthermore, this process may be applied to a structure that restricts the latch-up current by using a buffer layer of which $N^+$ and $N^-$ layers are compounded in duplicate.

Figure 8:
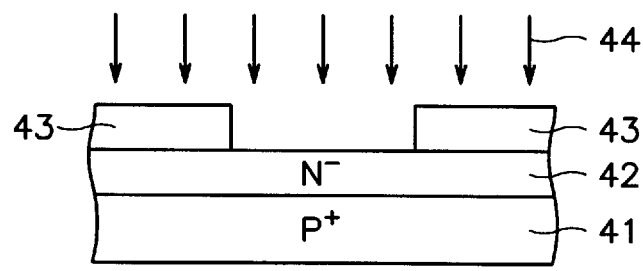
FIGS. 8, 9 and 10 are perpendicular-to-layer sectional views illustrating the order of production process for an IGBT including a semiconductor substrate according to the method of the present invention.
Figure 9:
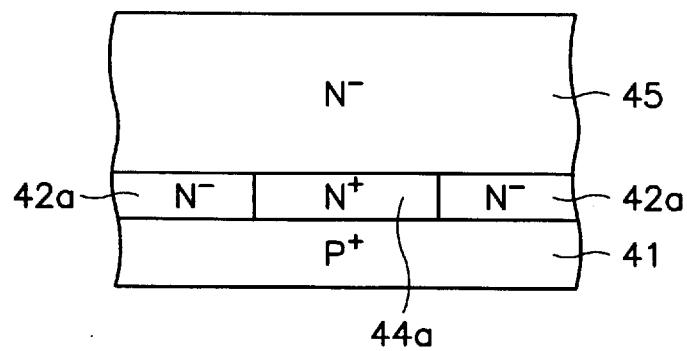
Figure 10:
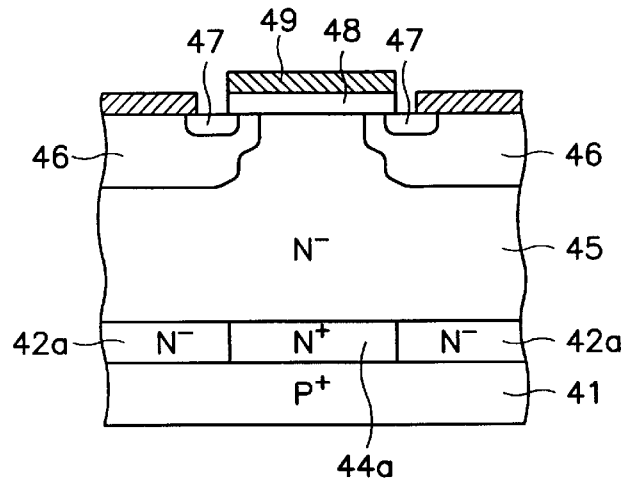

FIGS. 8, 9 and 10 illustrate successive steps in a method to produce an IGBT having a semiconductor substrate formed through ion implantation and diffusion according to a preferred embodiment of the present invention, in the order of the production process.

Firstly, in FIG. 8, a first low density, thin N-type epitaxial layer (42) is grown on $P^+$ silicon substrate (41), an oxidation film (43) is formed through thermal oxidation of the first epitaxial layer (42), a photoconductive film (unillustrated) is doped onto the oxidation film (43), a photoconductive film pattern (unillustrated) corresponding to the area, in which an insulated gate electrode is formed by a photo process, is formed, and the thermal oxidation film (43) exposed by using an etching mask for the above photoconductive film pattern is removed, and then, a high density N-type impurity (44), for example, boron is implanted throughout the product by ion-implantation.

Secondly, FIG. 9 illustrates a form in which a second low density $N^-$ epitaxial layer (45) is grown epitaxially after removing the thermal oxidation film (43), and $N^+$ (44a) and $N^-$ (42a) layers are formed horizontally, in alternation, through thermal diffusion of the high density impurities.

Finally, FIG. 10 shows that a buffer layer which is the lower part of a $P^-$ well (46) including the active area (47) of an IGBT device according to a preferred embodiment of the present invention is composed of a low density $N^-$ epitaxial layer (45), the lower part of gate electrode (49) in which the remaining insulated oxidation film (48) is included is the last perpendicular structure, which is composed of a high density N+ epitaxial layer (47). The surface of a wafer is undulated by removing a silicon oxidation film (43) formed by thermal oxidation in FIG. 8, and this undulation of the surface of the wafer may be maintained after growing the second $N^-$ epitaxial layer (45) and can be used as a benchmark when a cell is formed on the surface of $N^-$ layer (45).

Figure 11:
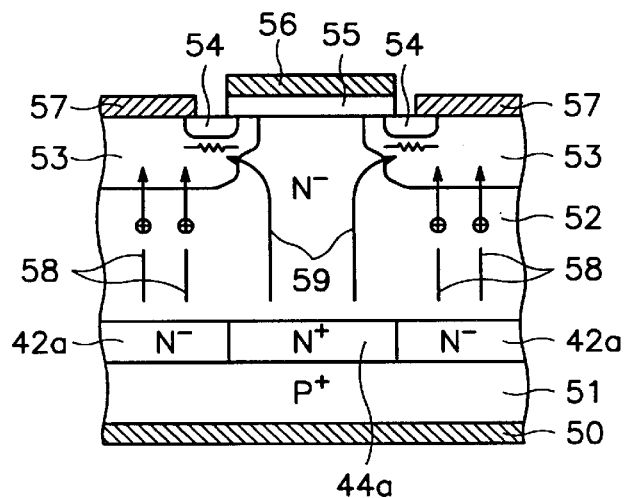
FIG. 11 is a diagram illustrating the flow of holes at turn-on of an IGBT device made according to the method of the present invention.
Figure 12:
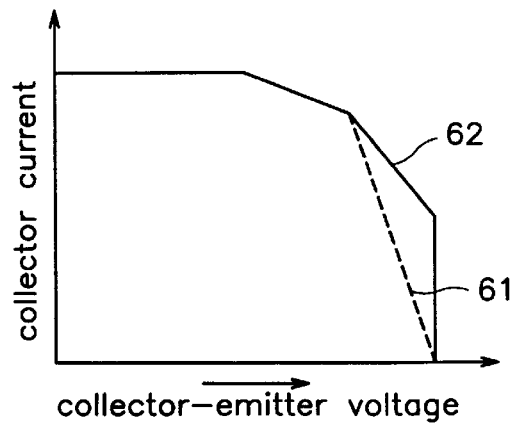
FIG. 12 is a diagram illustrating the safe operating area of an IGBT device made according to a preferred embodiment of the present invention, compared with that of a conventional IGBT device.

In FIG. 11, illustrating the flow of holes at turn-on of an IGBT device made according to the method of the present invention, the latch-up phenomenon is restrained, because the amount of holes (59), which pass through the high density $N^+$ epitaxial layer of the buffer layer via the silicon substrate (51) from the collector electrode (50) and escape to an emitter terminal via a $P^-$ well (53) and an active area (54), is smaller than the amount of holes (58), which pass through the low density $N^-$ epitaxial layer, as a result of reunion. Reference number 55 designates a gate insulated oxidation film and reference number 56 designates a gate electrode. FIG. 12 illustrates the safe operating area (62) of an IGBT device according to a preferred embodiment of the present invention compared with that (61) of a conventional IGBT device.

Therefore, according to a preferred embodiment of the present invention as described above, the present invention provides advantages of restraining the latch-up phenomenon during normal operation by improving the epitaxial layer of a semiconductor substrate for forming an IGBT device, and elevating the reliability of a semiconductor device by increasing the safe operating area and short circuit stability.

What is claimed is:

1. An IGBT comprising:
   a $P^+$ silicon substrate;
   a first epitaxial layer of a first conductive type disposed directly on said silicon substrate, said first epitaxial layer having:
      a first portion having a high density concentration of impurities of said first conductive type, and
      a second portion having a low density concentration of impurities of said first conductive type;
   a semiconductor substrate disposed on a top surface of said first epitaxial layer and composed of a second epitaxial layer of said first conductive type, said second epitaxial layer having a low density concentration of impurities of said first conductive type, said high density concentration of impurities of said first portion of said first epitaxial layer being distributed according to a predetermined concentration profile having a gentle slope such that the impurity concentration in said first portion of said first epitaxial layer near said top surface substantially corresponds to that of said second epitaxial layer and increases to a maximum value with a substantially uniform grade;
   a $P^-$ well disposed on a surface of said second epitaxial layer;

an active area formed in said P⁻ well; and a gate electrode formed over said semiconductor substrate such that it overlaps an edge portion of said P⁻ well, an insulated oxidation film being disposed between said gate electrode and said semiconductor substrate, said first and second portions of said first epitaxial layer being alternately formed in a horizontal direction such that said second portion is disposed below said P⁻ well, and said first portion is disposed below said gate electrode.

2. An IGBT of claim 1, wherein:

said first conductive type impurities are N type impurities.

3. An IGBT of claim 1, wherein:

a diffusion depth of said maximum value of the concentration of said first conductive type impurities implanted in said first portion of said first epitaxial layer is at least about 5 $\mu$m from said top surface of said first epitaxial layer.

* * * * *